United States Patent
Neugebauer et al.

(10) Patent No.: US 8,650,865 B2
(45) Date of Patent: Feb. 18, 2014

(54) EXHAUST GAS ROUTING DEVICE FOR AN INTERNAL COMBUSTION ENGINE HAVING A THERMOELECTRICAL GENERATOR

(75) Inventors: Stephan Neugebauer, Ohlstadt (DE); Andreas Eder, Munich (DE); Matthias Linde, Haar (DE); Boris Mazar, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 77 days.

(21) Appl. No.: 13/287,715

(22) Filed: Nov. 2, 2011

(65) Prior Publication Data

US 2012/0079820 A1 Apr. 5, 2012

Related U.S. Application Data

(63) Continuation of application No. PCT/EP2010/002140, filed on Apr. 3, 2010.

(30) Foreign Application Priority Data

May 8, 2009 (DE) .......................... 10 2009 020 424

(51) Int. Cl.
| | |
|---|---|
| *F02M 25/06* | (2006.01) |
| *F01N 3/00* | (2006.01) |
| *F01N 3/02* | (2006.01) |
| *F01N 5/02* | (2006.01) |
| *H01L 35/28* | (2006.01) |

(52) U.S. Cl.
USPC ................. 60/320; 60/278; 60/298; 136/208; 136/209; 136/210

(58) Field of Classification Search
USPC ............... 60/275, 278, 298, 320; 123/568.12; 136/208–210
See application file for complete search history.

(56) References Cited

U.S. PATENT DOCUMENTS

| | | |
|---|---|---|
| 960,324 A | 6/1910 | Hewlett |
| 2005/0172993 A1 | 8/2005 | Shimoji et al. |
| 2006/0226731 A1 | 10/2006 | Rider |
| 2007/0107982 A1 | 5/2007 | Sullivan |

FOREIGN PATENT DOCUMENTS

| | | |
|---|---|---|
| DE | 1 828 136 | 3/1961 |
| DE | 10 2005 005 077 A1 | 9/2005 |
| DE | 10 2006 019 282 A1 | 10/2007 |

(Continued)

OTHER PUBLICATIONS

International Search Report dated Jun. 29, 2010 with English translation (four (4) pages).

(Continued)

*Primary Examiner* — Kenneth Bomberg
*Assistant Examiner* — Audrey K Bradley
(74) *Attorney, Agent, or Firm* — Crowell & Moring LLP

(57) ABSTRACT

An exhaust gas routing device for an internal-combustion engine having a thermoelectric generator is fluidically connected with an exhaust gas line and a pipe guiding a coolant. The generator has a plurality of thermoelectric yoke pairs which are arranged between a first surface heated by the exhaust gas and a second surface cooled by the coolant. The exhaust gas routing device has a device guiding the exhaust gas along the first surface at a flow velocity that increases in the flow direction of the exhaust gas.

8 Claims, 6 Drawing Sheets

(56) References Cited

FOREIGN PATENT DOCUMENTS

| DE | 102006019282 A1 | * | 10/2007 | ............. F02D 29/06 |
| DE | 10 2007 063 172 A1 | | 7/2009 | |
| DE | 10 2008 002 096 A1 | | 12/2009 | |
| JP | 06002539 A | * | 1/1994 | ................ F01N 5/02 |
| JP | 7-12009 A | | 1/1995 | |
| JP | 07012009 A | * | 1/1995 | ................ F02G 5/02 |
| JP | 2006-2539 A | | 1/2006 | |

OTHER PUBLICATIONS

German Search Report dated Jan. 14, 2010 with partial English translation (nine (9) pages).

\* cited by examiner

EXHAUST GAS ROUTING DEVICE FOR AN INTERNAL COMBUSTION ENGINE HAVING A THERMOELECTRICAL GENERATOR

This application is a continuation of PCT International Application No. PCT/EP2010/002140, filed Apr. 3, 2010, which claims priority under 35 U.S.C. §119 from German Patent Application No. DE 10 2009 020 424.5, filed May 8, 2009, the entire disclosures of which are herein expressly incorporated by reference.

BACKGROUND AND SUMMARY OF THE INVENTION

The present invention relates to an exhaust gas routing device for an internal-combustion engine having a thermoelectric generator.

For the purpose of saving energy in the case of vehicles having internal-combustion engines, it has become known to provide thermoelectric generators in the exhaust gas line, which thermoelectric generators convert thermal energy to electric energy. The thus obtained electric energy can then, for example, be used for operating electric drives in the vehicle. Fuel can be saved in this manner because the electric energy does not have to be made available by means of the generating action of the internal-combustion engine.

German Patent document DE 10 2005 005 077 A1 discloses a thermoelectric generator for an internal-combustion engine. In the case of this known thermoelectric generator, damage to the generator elements is to be avoided in that the latter are arranged to be movable relative to a cooling mechanism and to a sleeve.

On the basis of U.S. Pat. Document US PS 960,324, a thermoelectric generator module has become known, which is to be suitable particularly for use at high temperatures.

Finally, the assignee's own German Patent document DE 10 2006 019 282 A1 describes an exhaust gas recirculation system for internal-combustion engines. Although this known exhaust gas recirculation system and the thermoelectric generator provided there have already had very good results, there is still space for improvement with respect to enhancing the performance of the thermoelectric generator.

Based on the above, there is therefore needed a device for routing exhaust gas for an internal-combustion engine by way of a thermoelectric generator that has a better performance characteristic.

This and other needs are met by an exhaust gas routing device for an internal-combustion engine having a thermoelectric generator fluidically connected to an exhaust gas line and with a line guiding a coolant, wherein the generator has a plurality of thermoelectric yoke pairs arranged between a first surface heated by the exhaust gas and a second surface cooled by the coolant. The exhaust gas routing device has a device guiding the exhaust gas along the first surface at a flow velocity increasing in the flow direction of the exhaust gas.

The invention is based on the recognition that the power yield of a thermoelectric generator can be improved if the individual thermoelectric yoke pairs of the generator each yield a largely equal and high electric power. The power of the thermoelectric yoke pairs is, among other things, a function of the temperature difference between the hot side and the cold side of the yoke pair.

At the location at which the hot exhaust gas enters into an exhaust gas routing device having the thermoelectric generator, the temperature of the exhaust gas will be higher than at the outlet side because the exhaust gas yields heat during its passage through the exhaust gas routing device, and a temperature gradient therefore exists from the inlet side to the outlet side.

When using thermoelectric yoke pairs of the same type in the flow direction, increased electric power could be achieved in an ideal condition if the temperature difference between the hot and cold side of the thermoelectric yoke pairs were to remain the same along the flow direction of the exhaust gas through the exhaust gas routing device. Also, any misalignment of the thermoelectric yoke pairs arranged along the flow direction has to be avoided.

As a function of the temperature difference, the yoke geometry and the thermoelectric material, a thermoelectric yoke pair has a characteristic electric current for achieving maximal recuperated electric power. Thus, a serial electrical circuiting of all yoke pairs, which is necessary for achieving a usable electric voltage, as a result of the changing temperature gradient in the flow direction in the case of a conventional construction, leads to a suboptimal electric current in the case of the plurality of the thermoelectric yoke pairs and therefore to a reduced power.

A temperature difference that remains the same along the entire exhaust gas routing device between the inlet side and the outlet side cannot be generated in the real operation of an exhaust gas routing device of the above-mentioned type. The invention solves this problem in a simple and efficient manner in that the device guides the exhaust gas along the first surface at a flow velocity that increases in the flow direction of the exhaust gas.

As a result, it is achieved that a lower flow velocity of the exhaust gas exists at the inlet side than at the outlet side. However, the exhaust gas temperature is also higher at the inlet side than at the outlet side.

By way of the lower flow velocity prevailing at the inlet side, a predefined heat transfer is achieved from the first hot surface to the thermoelectric yoke pairs arranged there. The exhaust gas dissipates heat when passing through the exhaust gas routing device, so that the temperature difference between the hot side and the cold side of the thermoelectric yoke pairs would decrease when it is assumed that a temperature of the coolant remains largely the same.

However, the flow velocity of the exhaust gas in the flow direction will increase simultaneously as a result of the device provided according to the invention, whereby the heat transfer in the flow direction of the exhaust gas can again be improved, and the negative effect of a temperature gradient between the inlet side and the outlet side of the gas routing device can be compensated.

In this manner, the temperature difference between the hot side and the cold side of the respective thermoelectric yoke pairs can be evened out along the flow direction through the exhaust gas routing device and thereby also the electric power of the thermoelectric yoke pairs, so that the problem of an electric misalignment of the thermoelectric leg yokes is also eliminated and the electric power as a whole that can be recuperated from the thermoelectric yoke pairs can be increased.

According to a further development of the invention, it is provided that the thermoelectric yoke pairs are arranged on a piping provided in the flow-through direction of the exhaust gas routing device. The device concentrically surrounds the piping. In the case of such an embodiment, known circular-disk-shaped thermoelectric yoke pairs can be used which are, for example, inserted into the annular gap between concentrically arranged pipes. In such an embodiment, the coolant can flow through the interior pipe according to the invention, so that the cooled second surface is situated radially on the inside, and hot exhaust gas flows around the exterior pipe on its outer circumference or the outer circumferential jacket surface, and the first surface heated by the exhaust gas is therefore situated radially on the outside.

Concentrically to the piping formed by the radially interior or radially exterior pipe, the above-mentioned device is provided which causes the flow velocity of the exhaust gas to rise in the flow direction of the exhaust gas from the inlet side of the exhaust gas routing device toward the outlet side. The increase of the flow velocity in the flow direction is achieved, for example, by an annular gap space between the device and the piping, thus, for example, the above-mentioned radially exterior piping, which annular gap space becomes smaller in the flow direction of the exhaust gas through the exhaust gas routing device.

Thus, the annular gap surface between the piping and the concentric device rises upstream toward the inlet side of the exhaust gas routing device according to an embodiment of the invention, which leads to an enlargement of the flow cross-section. When the flow cross-section in the area of the inlet side is compared to a flow cross-section of a known exhaust gas routing device, the thermoelectric generator of the inventive exhaust gas routing device has an electric power at the inlet that corresponds to that of the known exhaust gas routing device. However, the electric power of the known exhaust gas routing device with the flow cross-section that remains the same clearly decreases in the flow direction.

In the flow direction, a temperature gradient occurs between the inlet side and the outlet side. This temperature gradient leads to a lower temperature in the area of the outlet side of the exhaust gas routing device. Such a temperature gradient would result in a power drop of the thermoelectric yoke pairs in the flow direction, which, in the case of the exhaust gas routing device according to the invention, can, however, be compensated in that the flow cross-section of the device decreases in the flow-through direction of the exhaust gas guiding device and the flow velocity therefore rises. In view of the prevailing turbulent flow of the exhaust gas in the annular gap, this rise leads to an improvement of the heat transfer toward the hot side of the thermoelectric yoke pairs and thus to increased electric power.

The above-mentioned effect of the exhaust gas routing device can be achieved by the truncated configuration of the device provided according to the invention, which device concentrically surrounds the piping and ensures that the flow velocity of the exhaust gas increases in the flow direction.

According to a further development of the invention, a plurality of first and second surfaces arranged concentrically to one another is arranged in a housing having the exhaust gas routing devices for improving the electric power. In this case, the first surfaces heated by the exhaust gas are each surrounded by devices which are constructed in a truncated or conical fashion extending from the inlet side of the housing toward the outlet side and ensure an increase of the flow velocity of the exhaust gas relative to the first surface and thereby an improvement of the electric power of the thermoelectric generator as a whole.

The exhaust gas routing device according to the invention may be part of an exhaust gas recirculation system for an internal-combustion engine of a vehicle. It may have an exhaust gas cooler downstream which receives the exhaust gas cooled by the exhaust gas routing device and is fluidically connected with a fresh-air line of the internal-combustion engine for recirculating the exhaust gas for a reduction of pollutant emissions; i.e. the exhaust gas routing device can be integrated in an exhaust gas recirculation system.

The exhaust gas routing device according to the invention is also characterized in that an improvement of the electric power of the thermoelectric generator is achieved such that the second surface cooled by the coolant is situated radially on the inside and not, as in known arrangements, radially on the outside. The hot surface, around which the exhaust gas flows, for the heat transfer to the thermoelectric yoke pairs, is situated radially on the outside in this case, and correspondingly the surface cooled by the coolant is situated radially on the inside.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
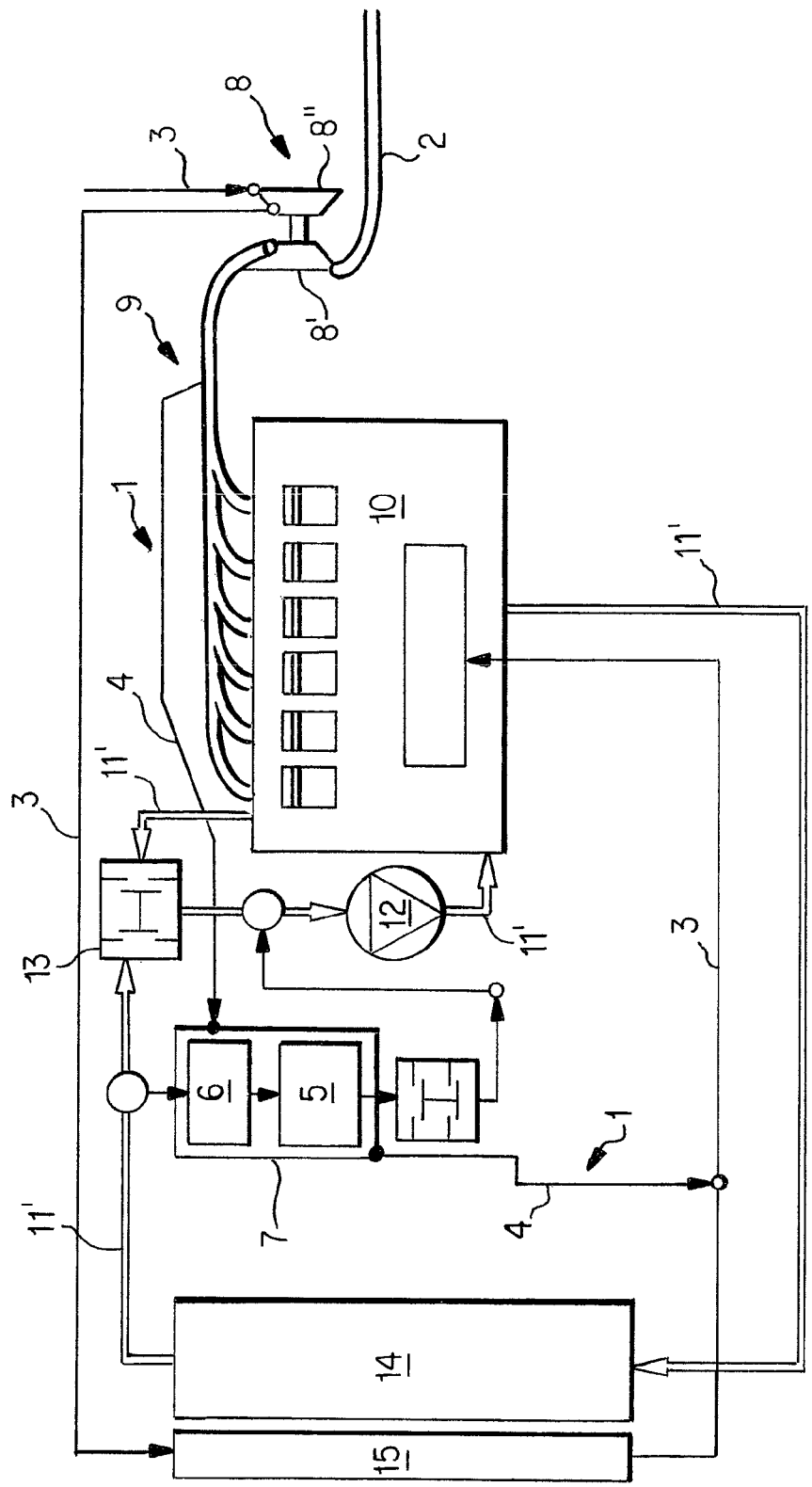
FIG. 1 is a schematic view of a functional exhaust gas recirculation system with an exhaust gas routing device according to an embodiment of the invention.

FIG. 1 shows a functional setup of an exhaust gas recirculation system 1 for an internal-combustion engine 10 having exhaust gas routing devices 6 arranged in a housing 7. The internal-combustion engine 10 has an exhaust gas line 2 and an intake line, as well as a coupling point 9 at which a portion of the exhaust gas is removed during the operation of the internal-combustion engine 10 for a later exhaust gas recirculation.

A turbine 8' of a turbocharger 8 is arranged in the exhaust gas line 2. The turbocharger 8 drives a compressor 8" in the fresh-air line 3. The compressor 8" delivers fresh air through the fresh air line 3 to a charge air cooler 15 from which the fresh air reaches the internal-combustion engine 10. The exhaust gas generated in the internal-combustion engine 10 is discharged by way of the exhaust line 2.

For the purpose of cooling, the internal-combustion engine 10 has a coolant circulation system 11'. The coolant heated by the internal-combustion engine 10 is fed to a heat transfer device 14 and is subsequently guided back to the internal-combustion engine 10 through a mixing valve 13 by means of a coolant pump 12.

The exhaust gas line 2 is fluidically connected by way of an exhaust gas pipe 4 with the fresh-air line 3, so that exhaust gas can be delivered into the combustion chamber of the internal-combustion engine 10 for the purpose of limiting pollutant emissions.

A plurality of exhaust gas routing devices 6 are situated in a housing 7, and an exhaust gas cooler 5 is arranged downstream of the exhaust gas routing devices 6. The exhaust gas routing devices 6 have thermoelectric yoke pairs 18 (see FIGS. 2-6) forming a thermoelectric generator.

Figure 2:
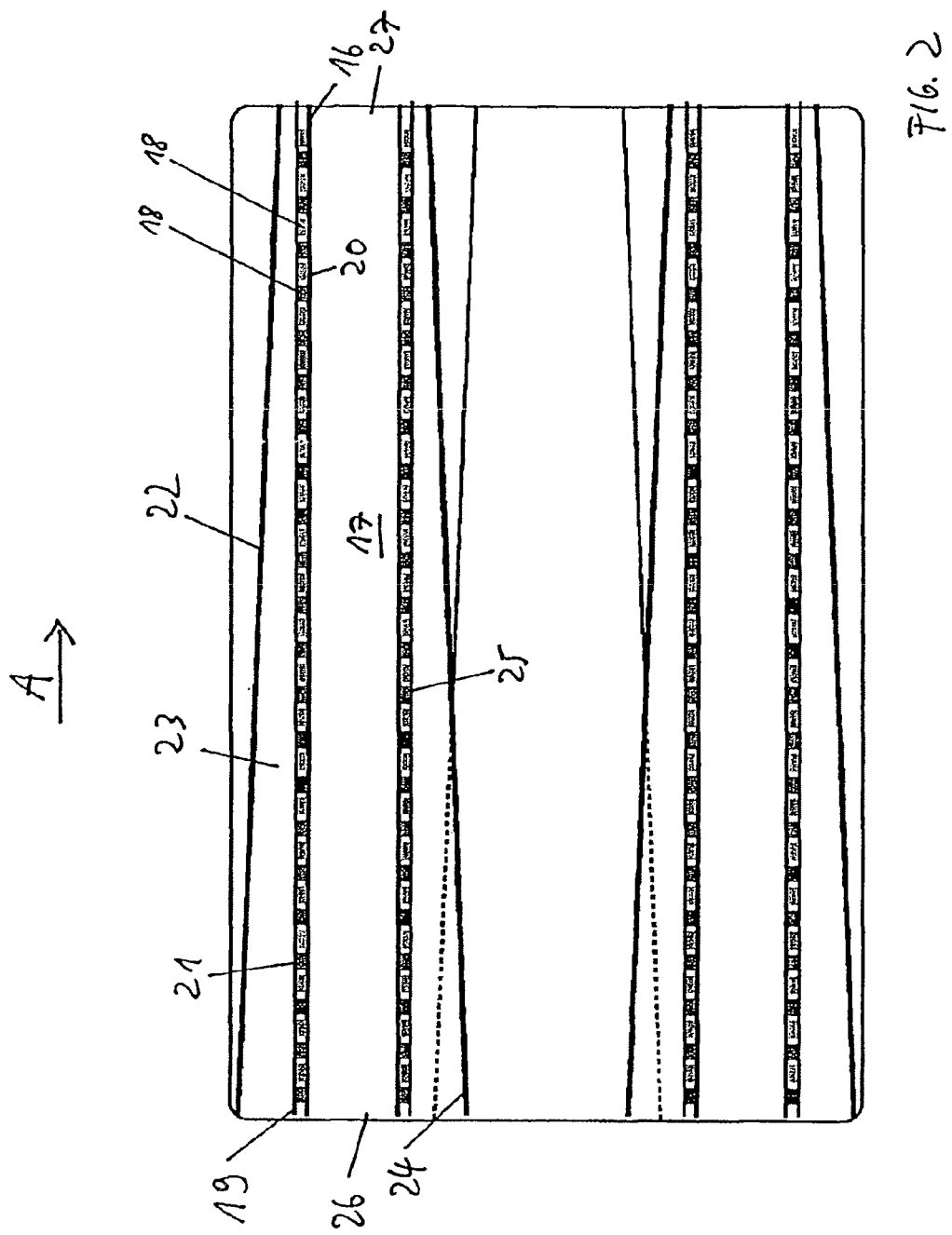
FIG. 2 is a sectional view of exhaust gas routing devices according to FIG. 1.

FIG. 2 of the drawing is a longitudinal sectional view of exhaust gas routing devices 6 which are arranged in the housing 7.

In the illustrated embodiment, the exhaust gas routing device 6 has a piping 16 situated radially on the inside through whose interior 17 the coolant from the coolant circulating system of the internal-combustion engine 10 can flow.

A plurality of thermoelectric yoke pairs 18 is arranged on the outer circumference of the piping 16, whose cold side is therefore assigned to the piping 16 situated on the inside. The hot side of the thermoelectric yoke pairs 18 is arranged in a piping 19 situated radially on the outside, which piping 19 is arranged concentrically with respect to the piping 16. The hot side of the yoke pairs 18 is therefore operated radially on the outside, and the cold side radially on the inside.

In the illustrated embodiment, the piping 16 situated on the inside forms a second surface 20 cooled by the coolant, while the piping 19 situated on the outside forms a first surface 21 heated by the exhaust gas. The thermoelectric yoke pairs 18 are situated between the first surface 21 and the second surface 20.

Concentrically to the pipings 16 and 19, a device 22 is arranged which is truncated in the illustrated embodiment and which forms an annulus 23 between the inner circumferential jacket surface or inner lateral surface 24 of the device 22 and the outer circumferential jacket surface 25 of the piping 19 situated on the outside, which annulus 23 becomes narrower in the flow direction (arrow A) of the exhaust gas.

As a result, the flow velocity of the exhaust gas increases in the flow direction A of the exhaust gas from the inlet side 26 of the exhaust gas routing device 6 in the direction of the outlet side 27. The heat transfer between the exhaust gas and the hot side of the thermoelectric yoke pairs 18 in contact with the surface 21 is thereby improved, so that also in the case of a temperature difference between the exhaust gas and the coolant flowing in the interior, which decreases in the flow direction A, the electric power supplied by the thermoelectric yoke pairs 18 can be improved.

In the area of the inlet side 26, the temperature of the exhaust gas is high and the flow velocity is low because of the large flow cross-section, so that a sufficient heat transfer can be achieved between the exhaust gas and the hot side of the thermoelectric yoke pairs 18. With the flow velocity of the exhaust gas increasing in the flow direction A, the negative effect of a steep temperature gradient in the exhaust gas between the inlet side 26 and the outlet side 27 of the exhaust gas routing device 6 can be compensated.

The result is that the exhaust gas routing device 6 provides an evened-out electric power of the thermoelectric generator having the thermoelectric yoke pairs 18 along the longitudinal direction of the exhaust gas routing device 6, which corresponds to the flow direction A of the exhaust gas.

Figure 3:
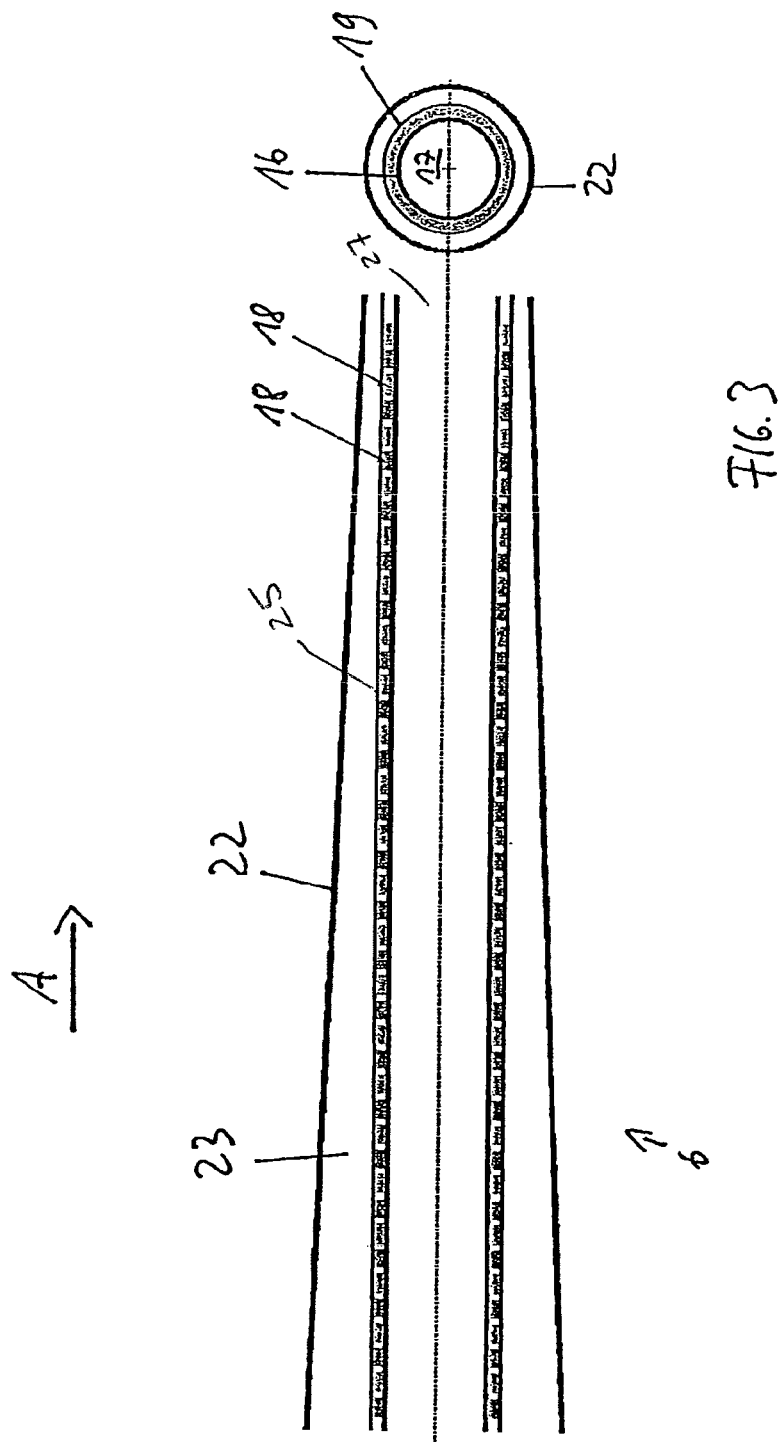
FIG. 3 is an enlarged view of a piping with a truncated device surrounding the piping.

FIG. 3 of the drawing is an enlarged view of an individual exhaust gas routing device 6 according to an embodiment of the present invention.

As easily visible, as a result of the truncated configuration of the device 22, an annulus 23 is formed in the case of the illustrated embodiment between the device 22 and the circumferential jacket surface 25, which annulus 23 has a flow cross-section surface that decreases in the flow direction A. This leads to the already addressed increase of the flow velocity in the direction of the flow of the exhaust gas through the exhaust gas routing device 6 and thereby to an improved heat transfer between the exhaust gas and the hot side of the thermoelectric yoke pairs 18. As illustrated in the circular-ring-shaped representation on the right side of FIG. 3, which is a view of the outlet side 27 of the exhaust gas routing device 6, in the illustrated embodiment, the pipings 16, 19 and the device 22 have a circular-ring-shaped and concentric construction.

Figure 4:
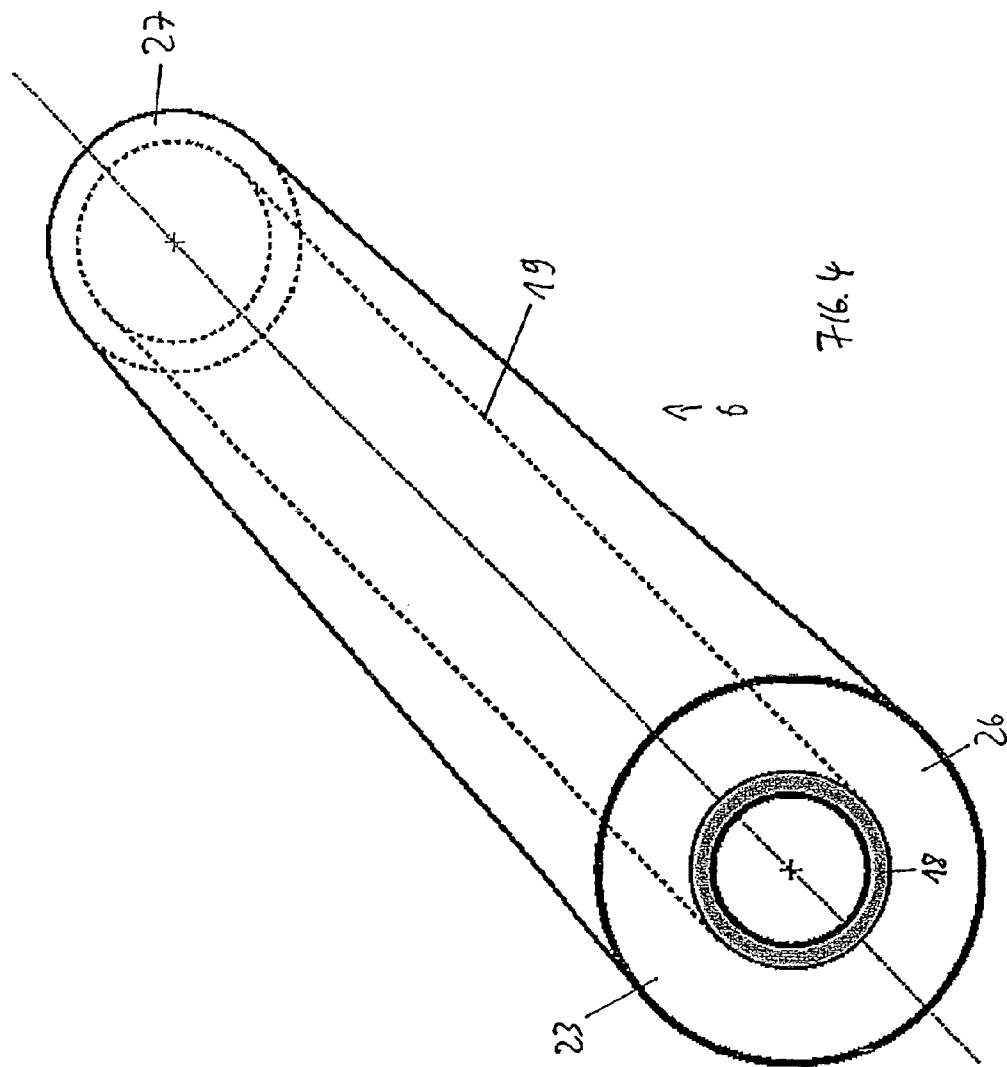
FIG. 4 is a perspective view of an individual exhaust gas routing device according to an embodiment of the invention.

FIG. 4 is a perspective view of the exhaust gas routing device 6. The exhaust gas flows into the annulus 23 at the inlet side 26, is then accelerated along the flow direction A on the path through the exhaust gas routing device 6, exits at the outlet side 27, and during its movement along the piping 19, gives off heat to the thermoelectric yoke pairs 18.

Figure 5:
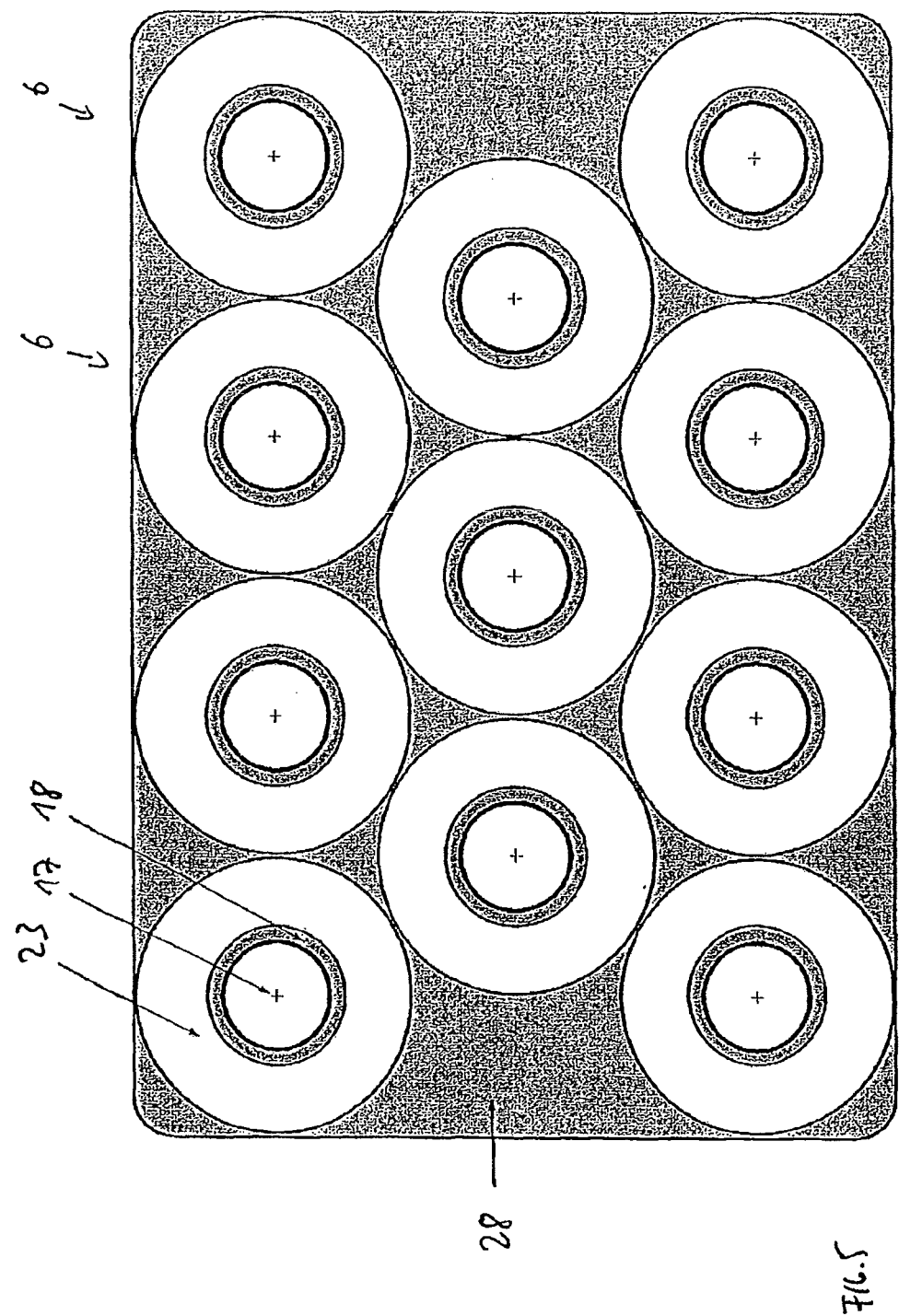
FIG. 5 is a top view of an inlet side of a housing having a plurality of exhaust gas routing devices.

Finally, FIG. 5 of the drawing is a view of a front side of the housing 7 with exhaust gas routing devices 6 arranged side-by-side and above one another. The outer dimensions of the housing 7 on the exhaust-gas-inlet-side face 26 of the exhaust gas routing devices 6 largely correspond to the outer dimensions of the stack-shaped structure of the exhaust gas routing devices 6.

Figure 6:
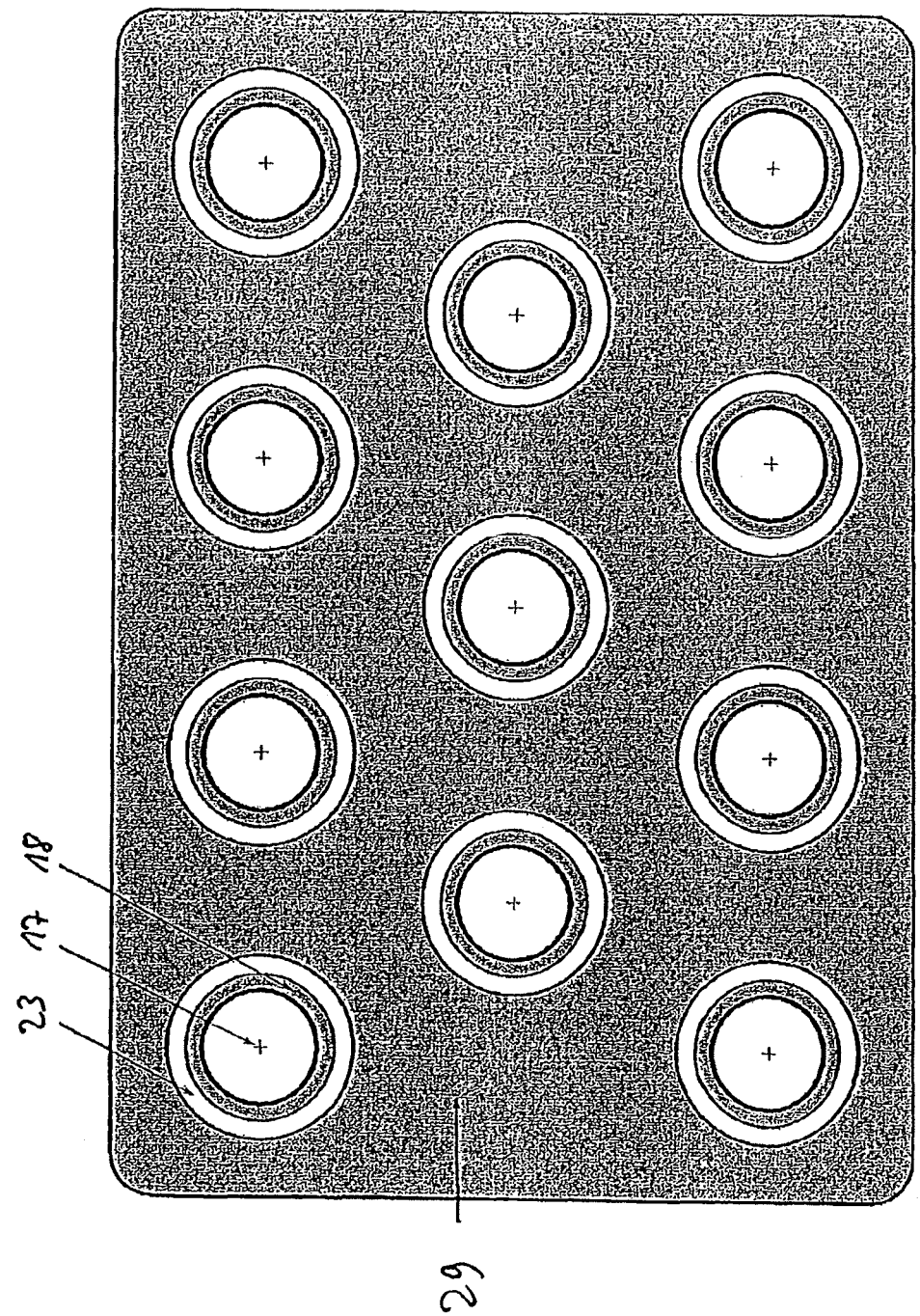
FIG. 6 is a top view of the outlet side of the housing according to FIG. 5.

FIG. 6 is a top view of the outlet side of the housing 7. As shown by a direct comparison of FIGS. 5 and 6, the annulus 23 available for the exhaust gas decreases continuously with respect to its surface area from the inlet side to the outlet side, which results in the above-mentioned flow velocity of the exhaust gas on its path through the exhaust gas routing device 6.

On the front side illustrated in FIG. 5 of the drawing as well as by means of FIG. 6, which shows the outlet side or back of the housing 7, the space around the inlet side and the outlet side, respectively, of the respective exhaust gas routing devices 6 is closed by use of perforated plates 28 and 29, respectively. The perforated plate 28 closes the housing space around the inlet sides of the exhaust gas routing devices 6 and provides a targeted introduction of the exhaust gas into the respective annulus 23.

LIST OF REFERENCE NUMERALS

1 Exhaust gas recirculation system
2 Exhaust gas line
3 Fresh-air line
4 Exhaust gas pipe
5 Exhaust gas cooler
6 Exhaust gas routing device
7 Housing
8 Turbocharger
8' Turbine
8" Compressor
9 Coupling point
10 Internal-combustion engine
11' Coolant circulating system
12 Coolant pump
13 Mixing valve
14 Heat transfer device
15 Charge air cooler
16 Piping
17 Interior
18 Thermoelectric yoke pair
19 Piping
20 Second surface
21 First surface
22 Device
23 Annulus
24 Circumferential jacket surface
25 Circumferential jacket surface
26 Inlet side
27 Outlet side
28 Perforated plate
29 Perforated plate
A Arrow The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An exhaust gas routing device for an internal-combustion engine, the exhaust gas routing device being fluidically coupleable with an exhaust gas line through which exhaust gas flows and a coolant pipe through which a coolant flows, the device comprising:
   a thermoelectric generator comprising a plurality of thermoelectric yoke pairs arranged between a first surface heated by the exhaust gas and a second surface cooled by the coolant; and
   an exhaust gas guide configured to guide the exhaust gas along the first surface at a flow velocity which increases in a flow direction of the exhaust gas, wherein the second surface is arranged radially interior of the first surface;
   wherein the first and second surfaces are concentric with respect to one another; and
   wherein the second surface is in contact with the coolant.

2. The device according to claim 1, further comprising:
   a housing in which a plurality of exhaust gas guides are arranged side-by-side and above one another in a stacked configuration; and
   wherein the housing has outer dimensions on an exhaust-gas inlet-side face corresponding to outer dimensions of the stacked configuration.

3. The device according to claim 2, further comprising:
   an exhaust gas cooler operatively arranged downstream of the exhaust gas routing device, the exhaust gas cooler receiving exhaust gas from the exhaust gas routing device and being fluidically coupleable with a fresh-air line of the internal-combustion engine for recirculating the received exhaust gas.

4. An exhaust gas routing device for an internal-combustion engine, the exhaust gas routing device being fluidically coupleable with an exhaust gas line through which exhaust gas flows and a coolant pipe through which a coolant flows, the device comprising:
   a thermoelectric generator comprising a plurality of thermoelectric yoke pairs arranged between a first surface heated by the exhaust gas and a second surface cooled by the coolant; and
   an exhaust gas guide configured to guide the exhaust gas along the first surface at a flow velocity which increases in a flow direction of the exhaust gas, wherein
   the thermoelectric yoke pairs are arranged on a piping provided in the flow-through direction of the exhaust gas routing device;
   wherein the exhaust gas guide concentrically surrounds the piping;
   wherein the exhaust gas guide has a truncated configuration, with an annulus being formed between an outer jacket surface of the piping and an inner jacket surface of the exhaust gas guide; and
   whereby the exhaust gas flows through the annulus.

5. The device according to claim 4, wherein the second surface is arranged radially interior of the first surface;
   wherein the first and second surfaces are concentric with respect to one another; and
   wherein the second surface is in contact with the coolant.

6. The device according to claim 4, further comprising:
   a housing in which a plurality of exhaust gas guides are arranged side-by-side and above one another in a stacked configuration; and
   wherein the housing has outer dimensions on an exhaust-gas inlet-side face corresponding to outer dimensions of the stacked configuration.

7. The device according to claim 4, further comprising:
   an exhaust gas cooler operatively arranged downstream of the exhaust gas routing device, the exhaust gas cooler receiving exhaust gas from the exhaust gas routing device and being fluidically coupleable with a fresh-air line of the internal-combustion engine for recirculating the received exhaust gas.

8. An exhaust gas routing device for an internal-combustion engine, the exhaust gas routing device being fluidically coupleable with an exhaust gas line through which exhaust gas flows and a coolant pipe through which a coolant flows, the device comprising:
   a thermoelectric generator comprising a plurality of thermoelectric yoke pairs arranged between a first surface heated by the exhaust gas and a second surface cooled by the coolant; and
   an exhaust gas guide configured to guide the exhaust gas along the first surface at a flow velocity which increases in a flow direction of the exhaust gas, wherein
   the thermoelectric yoke pairs are arranged on a piping provided in the flow-through direction of the exhaust gas routing device;
   wherein the exhaust gas guide concentrically surrounds the piping;
   further comprising:
   a housing in which a plurality of exhaust gas guides are arranged side-by-side and above one another in a stacked configuration; and
   wherein the housing has outer dimensions on an exhaust-gas inlet-side face corresponding to outer dimensions of the stacked configuration.

* * * * *